United States Patent [19]

Avraham et al.

[11] Patent Number: 5,304,872
[45] Date of Patent: Apr. 19, 1994

[54] TTL/CMOS INPUT BUFFER OPERABLE WITH THREE VOLT AND FIVE VOLT POWER SUPPLIES

[75] Inventors: Avi Avraham; Dror Avni; Daniel G. Genossar, all of Haifa, Israel

[73] Assignee: Intel Corporation, Santa Clara, Calif.

[21] Appl. No.: 927,593

[22] Filed: Aug. 10, 1992

[51] Int. Cl.⁵ .......................................... H03K 19/0185
[52] U.S. Cl. .................................... 307/475; 307/451; 307/296.3
[58] Field of Search ...................... 307/296.3, 451, 475

[56] References Cited

U.S. PATENT DOCUMENTS

| | | | |
|---|---|---|---|
| 4,593,212 | 6/1986 | Svager | 307/475 |
| 4,707,623 | 11/1987 | Bismark | 307/475 |
| 4,791,323 | 12/1988 | Austin | 307/475 |
| 4,820,941 | 4/1989 | Dolby et al. | 307/475 |
| 4,890,051 | 12/1989 | Kim et al. | 307/475 |
| 4,929,853 | 5/1990 | Kim et al. | 307/475 |
| 4,999,529 | 3/1991 | Morgan, Jr. et al. | 307/475 |

Primary Examiner—Edward P. Westin
Assistant Examiner—Benjamin D. Driscoll
Attorney, Agent, or Firm—Blakely, Sokoloff, Taylor & Zafman

[57] ABSTRACT

A dual mode input buffer having two modes of operation, a first mode of operation which provides a first CMOS level output from a TTL level input while operating at a first voltage level, and a second mode of operation which provides a second CMOS level output from a TTL level input while operating at a second voltage level. A first input provides TTl level inputs. An output provides a first CMOS level output and a second CMOS level output, one at at a time, depending on the mode of operation. A second input selects one of the two operation modes. Buffer means provides buffering of the signals provided on the first input. The buffer means has a level shifting transistor. Trip point level shifting means is provided for maintaining the trip point of the dual mode input buffer at approximately the same voltage level when the dual mode input buffer is operated at the second voltage level as when it operates at the first voltage level. A second input activates said trip point level shifting means.

15 Claims, 3 Drawing Sheets

TTL/CMOS INPUT BUFFER OPERABLE WITH THREE VOLT AND FIVE VOLT POWER SUPPLIES

BACKGROUND OF THE INVENTION

1. Field of the Invention

This invention relates to the field of semiconductor circuits, and more specifically to the field of integrated circuit input buffers.

2. Prior Art

Most present integrated circuits, such as microprocessors, have operating voltages $V_{CC}$ of approximately 5 volts. These circuits normally receive TTL level inputs, that is, they receive inputs in the 0–0.8 volt range to constitute a logical low signal, and inputs in the 2.0–5.0 volt range to constitute a logical high signal. Input buffers are provided for buffering and to convert TTL level inputs into 5 volt CMOS level signals which are utilized by the integrated circuit. With five volt CMOS level signals a logical low signal is represented by 0 volts and a logical high signal is represented by 5 volts only. Input buffers which input TTL level signals and output 5 volt CMOS level signals are well known in the art. These circuits are ideally designed so that they provide proper switching worst case scenarios; such as when a previous low TTL level input of 0.8 volts switches to a high TTL level input of only 2.0 volts. Ideally, input buffers which input TTL level signals are designed to toggle outputs at the midpoint, 1.4 volts, of the two worst case inputs.

Many modern integrated circuits, in order to decrease power dissipation, can now operate at 3 volts $V_{CC}$ as well as at 5 volts $V_{CC}$. Microprocessors which can operate in both a 3 volt and a 5 volt environment require two input buffers for each input signal. One input buffer tuned for receiving TTL level inputs when operating at 5 volts $V_{CC}$, and a second input buffer tuned for TTL level inputs when operating at 3 volts $V_{CC}$.

In the prior art, the two input buffers are connected to a 1:2 MUX. The 1:2 MUX enables one of the two input buffers, depending upon operating environment. This technique, however, is expensive because it requires two buffers and a MUX for each input of the integrated circuit. Since there are literally hundreds of inputs to modern integrated circuits, this technique requires substantial silicon area. Silicon area is always of limited supply in modern integrated circuits.

Thus, what is needed is a single input buffer which can provide proper buffering for two different operating modes, a 5 volt mode where the buffer inputs TTL level signals and outputs 5 volts CMOS level signals while operating at 5 volts $V_{CC}$ and a 3 volt mode where the buffer inputs TTL level signals and outputs 3 volt CMOS signals while operating at 3 volts $V_{CC}$.

SUMMARY OF THE INVENTION

A dual mode input buffer having two modes of operation, a first mode which provides a 5 volt CMOS level output from a TTL level input while operating at 5 volts $V_{CC}$ and a second mode which provides a 3 volt CMOS level output from a TTL level input while operating at 3 volts $V_{CC}$.

The dual mode input buffer of the present invention has a first input node for inputting TTL level signals in both operating modes. An output node outputs either 5 volt or 3 volt CMOS level outputs depending upon the mode of operation.

Buffer means is provided for buffering of the input signals provided on the first input. The buffer means comprises a pull-up transistor, a pull-down transistor and a level shifting transistor coupled between the pull-down and pull-up transistors. Weak feedback pullup means and inverters are also provided in the buffer means.

Trip point shifting means is provided for maintaining the trip point of the dual mode input buffer at approximately the same voltage level when operating the dual mode input buffer at 3 volts $V_{CC}$ as when operating the dual mode input buffer at 5 volts $V_{CC}$. The trip point of the dual mode input buffer is ideally suited for TTL level inputs. A second input is provided for activating the trip point shifting means. The trip point shifting means comprises an inverter coupled between the second input and the gate of a first PMOS transistor. The first PMOS transistor has its channel region coupled between the first input and a first node. A first NMOS transistor has its channel region coupled between the first input and the first node, the gate of the first NMOS transistor is coupled to the second input. A second PMOS transistor has its gate coupled to the second input and its channel region coupled between a supply voltage and the first node. A third PMOS transistor has its gate electrode coupled to the first node and its channel coupled between the supply voltage and the level shifting transistor.

Power down circuitry is provided for disabling the dual mode input buffer during power down situations. In the power down embodiment, a third input is provided for signalling a power down condition. The gate of the level shifting transistor is coupled to the third input in the power down embodiment instead of to $V_{CC}$. An inverter is coupled between the third input and a gate of a second NMOS transistor. The channel of the second NMOS transistor is coupled between ground $V_{SS}$ and the node which couples the pulldown transistor to the level shifting transistor. In this embodiment, during power down the buffer is effectively disabled so that no toggling can occur and so that no DC path results when the first input floats during power down.

A goal of the present invention is to provide a single input buffer which is capable of buffering input signals to integrated circuits under two different operating conditions. Under the first operating conditions, the buffer receives TTL level signals and outputs 5 volt CMOS level signals while operating at 5 volts $V_{CC}$. Under the second operating conditions, the buffer inputs TTL level signals and outputs 3 volt CMOS level signals while operating at 3 volts $V_{CC}$.

Another goal of the present invention is to save silicon area and manufacturing costs of an integrated circuit by utilizing a single buffer where previously two buffers and a MUX were required.

Yet another goal of the present invention is to provide trip point shifting means to the buffer with as little time delay penalty as possible.

Yet another goal of the present invention is to prevent power consumption by the chip at prespecified times by preventing the input buffer from toggling and by preventing the formation of D.C. current paths which can expend considerable power.

Other features and advantages of the dual mode input buffer of the present invention will become apparent in the detailed description which follows.

DETAILED DESCRIPTION OF THE PRESENT INVENTION

The present invention discloses a novel dual mode input buffer which is capable of operating in both 3 volt and 5 volt operating voltage $V_{CC}$ environments. In the following description, numerous specific details are set forth such as transistor types and dimensions in order to provide a thorough understanding of the present invention. However, it will be obvious to one skilled in the art that the present invention may be practiced without these specific details. In other instances, well-known circuit design concepts have not been set forth in detail in order not to unnecessarily obscure the present invention.

Figure 1:
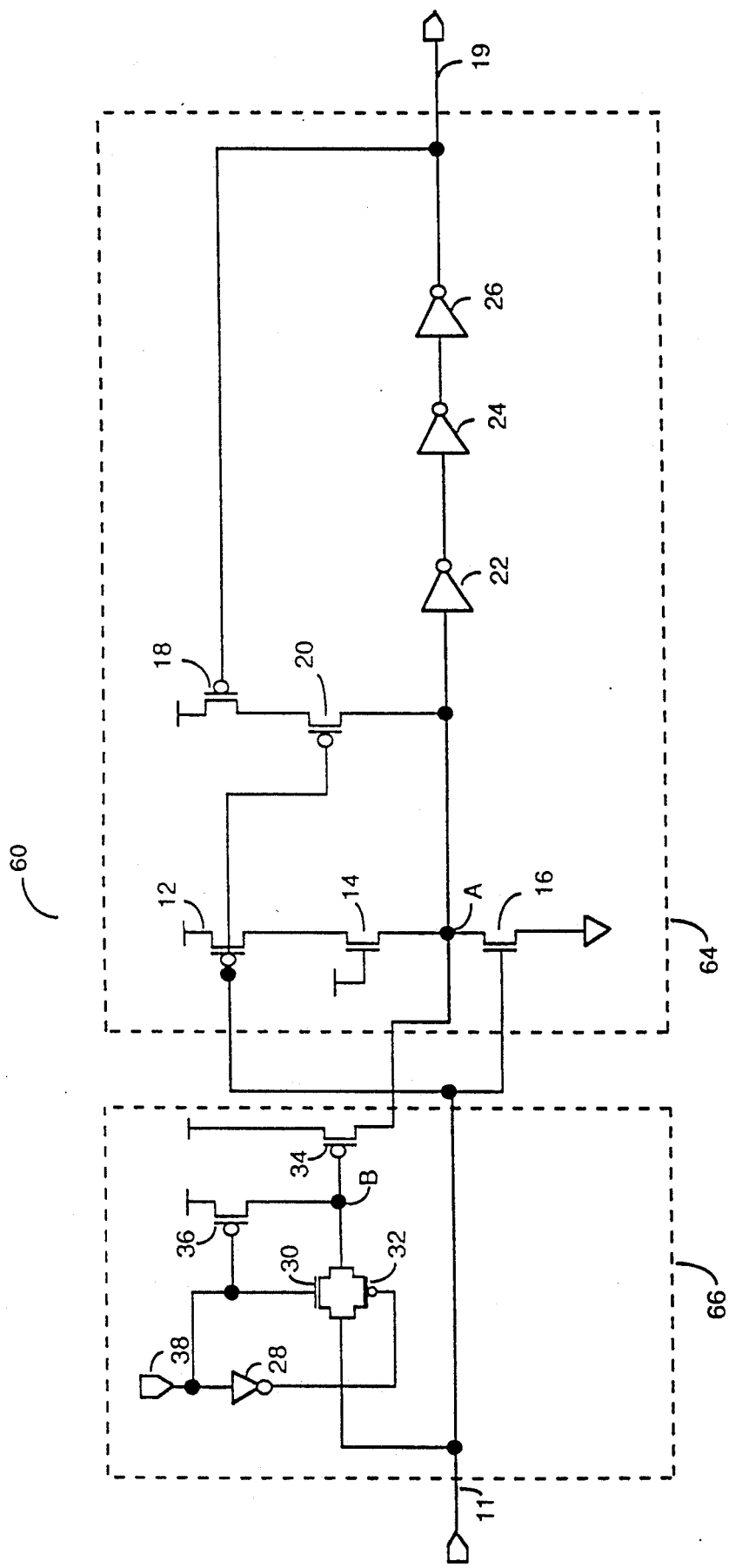
FIG. 1 is an illustration of the dual mode input buffer of the present invention.

The preferred embodiment of the dual mode input buffer of the present invention is illustrated in FIG. 1. The dual mode input buffer 60 of the present invention can be operated in two modes. A first mode which inputs a TTL level signal and outputs, a corresponding 5 v CMOS level signal while operating in a 5 volt $V_{CC}$ environment, and a second mode which inputs a TTL level signal and outputs a corresponding 3 volt CMOS level signal while operating in a 3 volts $V_{CC}$ environment. The dual mode input buffer 60 is ideally situated for use in integrated circuits, such as microprocessors, which can be found in 3 volt systems as well as in 5 volt systems. The dual mode input buffer provides reliable buffering of input signals for an integrated circuit operating in either environment.

The dual mode input buffer 60 of the present invention is a CMOS circuit. That is, the buffer contains both PMOS and NMOS field effect transistors. NMOS transistor refers to a standard metal oxide semiconductor transistor wherein the source and drain are n-type silicon and the channel is p-type silicon. A PMOS transistor refers to a standard MOS transistor wherein the source and drain are p-type silicon and the channel is n-type silicon. A gate electrode controls the channels conductivity. A PMOS transistor essentially conducts when the gate voltage is low and a NMOS transistor essentially conducts when the gate voltage is high. When an MOS transistor conducts, elements coupled to the transistor's source essentially become electrically coupled to elements coupled to the transistor's drain.

In the present invention, the MOS transistors are symmetrical transistors so drawing a distinction between source and drain regions is unnecessary. Additionally, when it is said that a transistor has its channel coupled between two elements, the elements are coupled to opposite source/drain regions of the transistor. The dual mode input buffer 60 comprises two discrete elements, a standard TTL level input buffer 64 tuned for 5 volt VCC operating conditions, and a trip point level shifting circuit 66.

Coupled to data input node 11 of the present invention is a standard single mode input buffer 64. The single mode input buffer 64 comprises a PMOS transistor 12, a pull up transistor, which has its gate coupled to the data input node 11 of the dual mode input buffer 60. The channel of the PMOS transistor 12 is electrically coupled to supply voltage $V_{CC}$ and to level shifting transistor 14. The gate of level shifting transistor 14 is coupled to $V_{CC}$. The channel of level shifting transistor 14 is coupled between node A and PMOS transistor 12. A NMOS transistor 16, a pull down transistor, has its gate coupled to the data input node 11 of the dual mode input buffer 60. The channel of the NMOS transistor 16 is coupled between node A and ground $V_{SS}$.

The standard single mode input buffer 64 also provides weak feedback pull up means. A PMOS transistor 18 has its gate coupled to the output terminal 19 of the dual mode input buffer. The channel of PMOS transistor 18 is coupled between $V_{CC}$ and PMOS transistor 20. The gate of PMOS transistor 20 is coupled to data input node 11. The channel of PMOS transistor 20 is coupled between node A and PMOS transistor 18. Inverters 22, 24, and 26 are connected in series between node A and the output 19 of the dual mode input buffer. The inverters are provided to ensure adequate driving capability.

The standard single mode input buffer 64 provides buffering for input signals on data input terminal 11. The standard single mode input buffer 64 is tuned for TTL level inputs while operating at 5 volts $V_{CC}$. The single mode input buffer is designed to faithfully provide a high CMOS output of 5 volts for a TTL level input in the range of 2.0–5.0 volts when operating at 5 volts $V_{CC}$. The single mode input buffer 64 provides a low CMOS output of zero volts for a TTL level input in the range of 0–0.8 volt when operating at 5 volts $V_{CC}$.

Level shifting transistor 14 is provided to optimize the trip point of single mode input buffer 64 for TTL level inputs in a 5 volt $V_{CC}$ environment. The single mode input buffer 64 has a trip point of approximately 1.32 volts when a 5 volt operating voltage $V_{CC}$ is applied. The trip point level of a buffer referes to the voltage level at the input necessary to cause the output of the first stage of the buffer to toggle. In our case, when a 1.32 voltage level is applied to data input terminal 11, the output of the first stage, node A, of the single mode input buffer 64 toggles or changes states.

It is noted that a trip point level of approximately 1.32 volts is near the ideal trip point of 1.4 volts which is the midpoint of worst case TTL inputs 0.8 volts and 2.0 volts. The size ratio of pullup transistor 12 and pull down transistor 16 is also designed to favorably influence the trip point level for TTL level inputs.

Although a specific single mode input buffer has been disclosed, other standard single mode input buffers may be equally applicable to the present invention. The buffer should have a trip point which is commensurate with TTL level inputs when operating at 5 volts. The single mode input buffer should have a TTL level trip point which is set at least partially by a level shifting transistor. The buffer should be able to drive the value provided at the external pin into the integrated circuit, and at the same time shape the signal and make sure it has the correct CMOS level output.

Coupled to node A and to data input node 11 is a trip point level shifting circuit 66. Trip point level shifting circuit 66 has an input 38. Coupled to input 38 is an inverter 28, a gate electrode of an NMOS transistor 30, and a gate electrode of a PMOS transistor 36. Coupled to inverter 28 is the gate of a PMOS transistor 32. Both NMOS transistor 30 and PMOS transistor 32 have their respective channels coupled between data input node 11 and node B. PMOS transistor 36 has its channel coupled between $V_{CC}$ and node B. Also coupled to node B is the gate of PMOS transistor 34. PMOS transistor 34 has its channel coupled between $V_{CC}$ and node A of the standard single mode input buffer 64. PMOS transistor 34 pulls node A up to $V_{CC}$ when it conducts.

In the first mode of operation, the dual mode input buffer 60 operates under normal 5 volt $V_{CC}$ operating conditions. In the first mode, the circuit can receive both TTL inputs and 5 volt CMOS level inputs. Trip point level shifting circuit 66 of the present invention is what allows the dual mode input buffer 60 to operate in two modes. If an integrated circuit which contains the buffer of the present invention is to be operated under normal 5 volt operating conditions, a low signal would be placed on input 38 and all $V_{CC}$ nodes would be provided with 5 volts. When input 38 is low, transistors 30 and 32 are both off, and PMOS transistor 36 is on, driving node B to $V_{CC}$ (5 volts). When node B is high, PMOS transistor 34 is off, and trip point level shifting circuit 36 is out of the circuit. In this way, the dual mode input buffer 60 of the present invention simply becomes the standard single mode input buffer 64. As mentioned earlier, the single mode input buffer 64 is tuned to handle TTL level inputs while operating at 5 volts $V_{CC}$. That is, single mode input buffer 64 has a trip point of approximately 1.3 volts when operating at 5 volts $V_{CC}$. Thus, by placing a low signal on node 38 while the dual mode input buffer is operated at 5 volts $V_{CC}$ the dual mode input buffer has a trip point of 1.3 volts.

In the second mode of operation, the dual mode input buffer 60 operates at 3 volts $V_{CC}$ and receives a high input on node 38. In this mode the dual mode input buffer can receive either TTL level inputs or 3 volt CMOS level inputs. In the second mode of operation the dual mode input buffer outputs 3 volt CMOS level signals. Three volt CMOS level signals mean that a low state corresponds to 0 volts and a high state corresponds to 3 volts. In the second mode of operation, as in the first mode of operation, the dual mode input buffer is tuned for TTL level inputs. In the second mode of operation the buffer has a trip point approximately equal to 1.3 volts which is approximately the same trip point level as the buffer had in the first mode of operation. When operating the dual mode input buffer at 3 volts $V_{CC}$, activating the trip point shifting circuit 66 (by providing a high signal on input 38) gives dual mode input buffer a trip point of about 1.3 volts.

When single mode input buffer 64 is operated at 3 volts (3 volts $V_{CC}$) the trip point of the single mode input buffer 64 is approximately 1.0 volts which is significantly below the desired midpoint of 1.4 volts. Such a low trip point is undesirable for TTL level inputs because such a low trip point is too close to the upper limit of TTL Vil. (i.e., it's too close to the highest input voltage (0.8 v) that must still be considered low for TTL level inputs). Such a low trip provides little margin for error in generating and interpreting input signals. It is, therefore, the function of trip point level shifting circuit 66 to shift the trip point of the single mode buffer 64 from 1.0 volts to 1.3 volts when operating at 3 volts $V_{CC}$. In this way trip point level shifting circuit 66 maintains the trip point of dual mode input buffer 60 at approximately the same voltage level of 1.3 volts when the dual mode input buffer is operated at 3 volts $V_{CC}$ as when it is operated at 5 volts $V_{CC}$.

In order to operate the dual mode input buffer 60 in the second mode of operation a high signal is placed on input 38 and all $V_{cc}$ nodes receive 3.0 volts. A high signal on input 38 turns transistors 30 and 32 on and turns transistor 36 off. This action couples data input node 11 to node B. In this way, when operating in the 3 volt mode data provided at data input node 11 propagates to node B. If the input on data input node 11 is low, then PMOS transistor 34 turns on. When PMOS transistor 34 turns on it works in parallel with PMOS transistor 12 and NMOS transistor 14 to pull node A up to a voltage of $V_{CC}-V_{t14}$. ($V_{t14}$ is the threshold voltage of NMOS transistor 14.) Once node A reaches this voltage, transistor 34 finishes the job of pulling node A up to $V_{CC}$ (3 volts).

By bypassing level shifting transistor 14 of single mode buffer 64 when the data input 11 is low, the trip point level of the single mode buffer 64 changes from 1.0 volts to 1.3 volts under 3 volt operating conditions. The latter value is ideal for TTL level inputs. The latter value is also more in line with the ideal trip point level of 0.5 $V_{CC}$ or 1.5 volts for a 3 volt operating environment with 3 volt CMOS level inputs. Thus, activating trip point level shifting circuit 66 while operating at 3 volts $V_{CC}$ maintains the trip point of the dual mode input buffer 60 at a level which is the same as when the dual mode input buffer is operated at 5 volts $V_{CC}$ with the trip point level shifting circuit deactivated. The 1.3 volt trip point of the dual mode input buffer is ideal for TTL level inputs. In this way, the single dual mode input buffer 60 of the present invention is able to operate reliably under two different operating conditions one with 5 volts $V_{CC}$ and TTL level inputs and one with 3 volts $V_{CC}$ and TTL level inputs.

It is to be appreciated that the dual mode input buffer of the present invention can also receive both 3 volt and 5 volt CMOS level inputs if desired. This is because 3 and 5 volt CMOS level inputs are by definition restricted to 0 volts and 3 volts and to 0 volts and 5 volts, respectively. These inputs are well away from the trip point of the dual mode input buffer 60 so that the buffer is able to reliably react to such inputs. Still further, if the dual mode input buffer 60 is provided with a Vcc of 5 volts and and a high input on node 38, thereby turning on trip point level shifting circuit 66, the trip point of the dual mode input buffer becomes approximately 2.05 volts which is even more suitable for 5 volt CMOS level signals.

The design of trip point level shifting circuit 66 is such that it provides little AC penalty for its addition. The addition of level shifting circuit 66 to a standard single mode input buffer 64 costs only a 0.3 nanosecond delay to the buffer. Such a small delay is insignificant to overall buffer performance.

Figure 2:
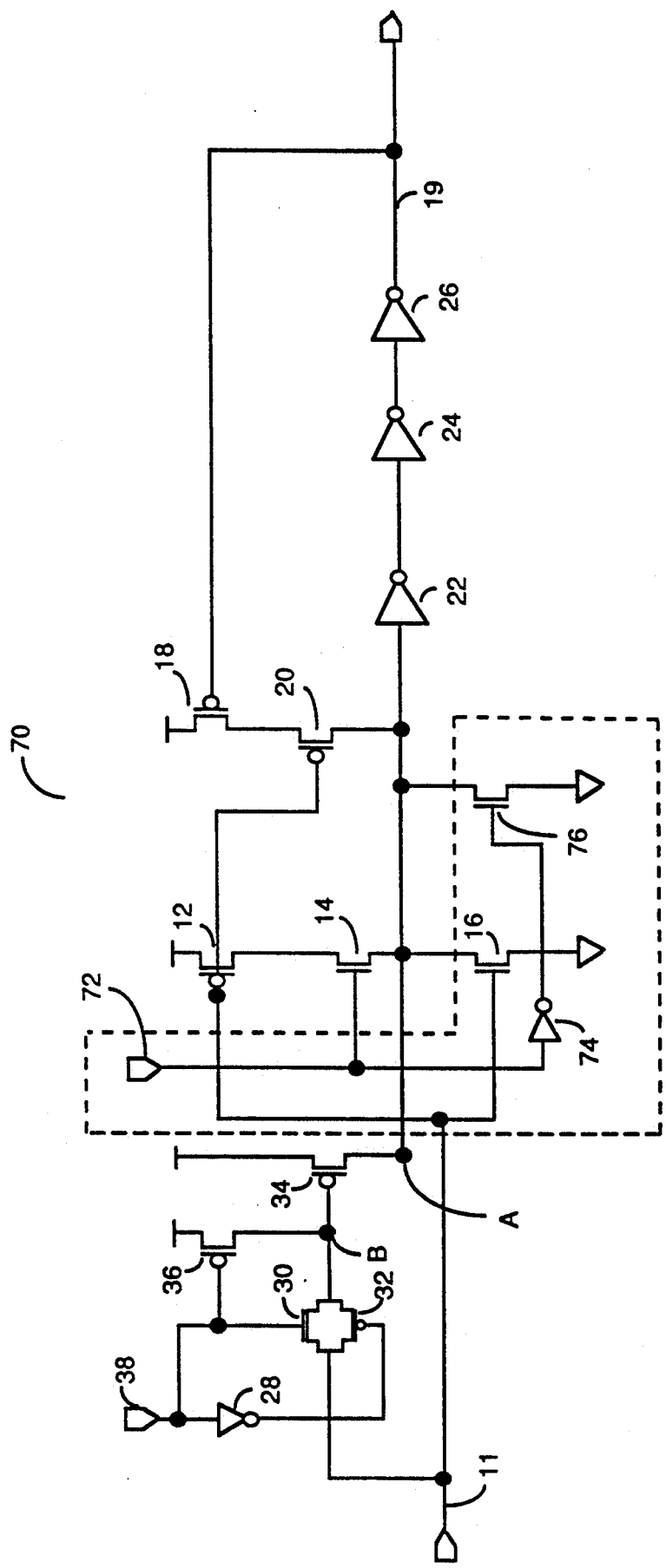
FIG. 2 is an illustration of the power down dual mode input buffer of the present invention.

FIG. 2 shows a second embodiment of the dual mode input buffer of the present invention. This embodiment is a power down version of dual mode input buffer 60. "Powering down" of a chip is a method of reducing unnecessary power consumption when the integrated circuit is not in use. In static CMOS design, no power is consumed by the chip when all nodes are at a $V_{SS}$ or $V_{CC}$ voltage level and no toggling occurs within the chip. Substantial power can be saved, therefore, by reducing the amount of toggling within a chip when it is not in use. A chip reduces its internal toggling by detecting when it is not performing any operation. The chip then stops the internal clock to most of the chip, thereby reducing the amount of toggling within the chip. Reduction of internal circuit toggling can drastically reduce the overall power consumption of a chip. Such "powering down" of circuits when not in use reduces power consumption by a substantial amount. Powering down is normally required in situations where power use must be conserved such as in laptop and pocket computers. Long battery life is essential in these applications.

The power down embodiment 70 of the dual mode input buffer 60 is a slightly modified version of dual mode input buffer 60. The power down embodiment 70 provides an additional input 72 for indicating when the circuit is being powered down. Power down input 72 is coupled to inverter 74 which in turn is coupled to the gate electrode of an NMOS transistor 76. The channel of NMOS transistor 76 is coupled between node A and ground $V_{SS}$. Power down input 72 is also coupled to the gate of level shifting transistor 14. It is noted that in this embodiment the gate of level shifting transistor 14 is coupled to input 72, and not to $V_{CC}$.

The power down dual mode input buffer 70 is designed ideally for integrated circuit chips which are to be powered down frequently. The additional circuitry of the dual mode input buffer 70 prevents undesired power consumption by the buffer during power down in two ways. First, if the external pin to the buffer is toggled during power down, the additional circuitry prevents a resultant toggling of the input buffer so that no power is consumed by such toggling. Second, if the external pin floats (tri-state) at a voltage higher than $V_{Tn16}$ and lower than $V_{CC}-V_{Tp12}$, the additional circuitry prevents a potential D.C. current path from forming in the input buffer which could result in unnecessary power consumption.

During internal power down a low signal is placed on input 72. This signal is inverted by inverter 74 which turns on NMOS transistor 76. NMOS transistor 76 then pulls down node A to low. Also at this time, input 72 turns off level shifting transistor 14. These actions drive output node 19 to high and cut out PMOS pull-up 18. Thus, a potential DC path, which could have occurred from $V_{CC}$ through transistors 18, 20, and 16 to $V_{SS}$ if the input node floated to a voltage slightly over the threshold voltage of NMOS transistor 16, has been eliminated. Additionally, the power down circuitry of buffer 70 essentially disables the buffer 70 during power down, and thereby prevents its toggling and the resultant consumption of power if there is activity on the external input pins. The additional circuitry of power down dual mode input buffer 70 prevents potential wastes of power.

When power down input buffer circuitry 70 is not powered down, a high signal is placed on input 72 which in turns turns on NMOS transistor 14 and turns off NMOS transistor 76. In this way, when not powered down, power down dual mode input buffer 70 resembles and has the electrical characteristics of dual mode input buffer 60.

Figure 3:
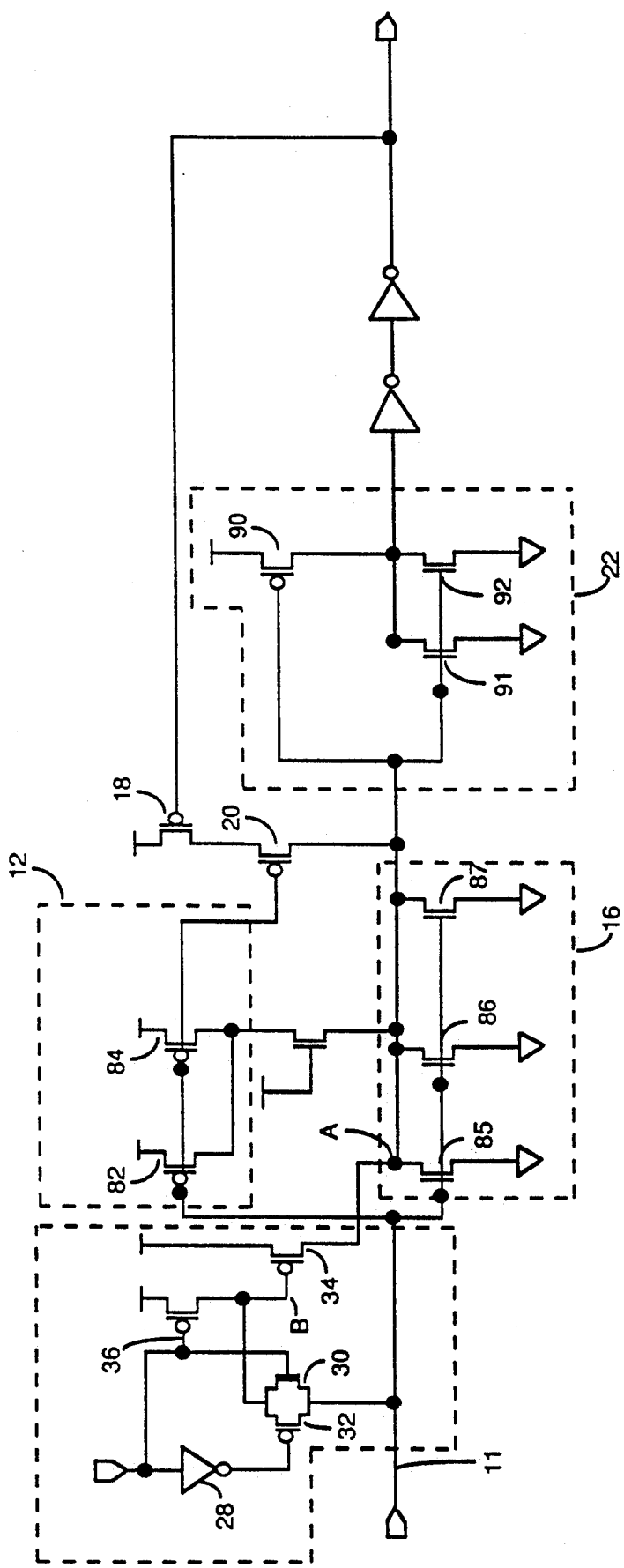
FIG. 3 is an illustration of the dual mode input buffer of the present invention further detailing various components of the dual mode input buffer.

In FIG. 3, some of the features of the dual mode input buffer 60 are shown in the form in which they are implemented in silicon using a 1.2 micron technology. Because pull-up transistor 12 and pull-down transistor 16 require physical characteristics which preclude them from being implemented with a single transistor, each comprises a plurality of transistors operating together. That is, PMOS pull-up transistor 12 is actually implemented with two PMOS transistors 82 and 84 having their respective channels coupled between $V_{CC}$ and level shifting transistor 14. Each of the PMOS transistors 82 and 84 has dimensions 12.5/2.5. The dimensions are given in the standard form of Z/L where Z is the transistors channel width in microns and L is the transistors channel length in microns. Level shifting transistor 14 can be implemented by a single transistor having physical dimensions of 8.0/5.0. NMOS pull-down transistor 16 comprises three NMOS transistors 85, 86 and 87, each having dimensions of 12.5/3.0. Each of the NMOS transistors 85, 86 and 87 have their respective gate electrodes coupled to data input node 11 and their respective channels coupled between node A and ground $V_{SS}$.

The size ratio of the pullup transistors 82 and 84 to the pulldown transistors 85, 86 and 87 is design to help optimize the trip point level of the dual mode input buffer for TTL level inputs. The weak feedback pull-up means, transistors 18 and 20 are single transistors of dimensions 5.0/3.0 and 5.0/14 respectively. In FIG. 3, inverter 22 is shown as a CMOS inverter having a 1:2 ratio between the channel width of the PMOS transistor 90 and the NMOS transistors 91 and 92. Such a ratio results in a bias of the trip point from the traditional $V_{CC}/2$ value. Invertor 22 comprises PMOS transistor 90 of dimensions 8.0/2.0 and two NMOS transistors 91 and 92 each of 8.0/2.0 dimensions.

A dual mode input buffer 60 and a power down version 70 of the dual mode input buffer 60 have been described in detail. Such detail is not intended to limit the scope of the present invention. It is assumed that one may easily vary such things as operating voltages, transistor types and sizes, additional buffering stages, and trip point levels in order to optimize the teachings of the present invention for use in particular applications and environments.

Thus, a novel dual mode input buffer has been described which is capable of operating in two modes. One mode for normal operating conditions of 5 volts $V_{CC}$ and TTL level inputs, and a second mode for operating conditions of 3 volts $V_{CC}$ and TTL level inputs. The novel dual mode input buffer can be slightly modified so that it can be disabled during internal power down situations, and thereby prevent unnecessary power consumption during power down.

What is claimed is:

1. A dual mode input buffer having two modes of operation, a first mode which provides first CMOS level outputs from TTL level inputs while operating at a first voltage level, and a second mode of operation which provides second CMOS level outputs from TTL level inputs while operating at a second voltage level, said dual mode input buffer comprising:
   a first input for providing input data to said input buffer, said first input capable of providing said TTL level inputs;
   a first stage comprising:
      a first pull-up transistor, the gate of said first pull-up transistor coupled to said first input, the channel of said first pull-up transistor coupled between a supply voltage and the channel of a level shifting transistor;
      a first pull-down transistor, the gate of said first pull-down transistor coupled to said first input, the channel of said first pull-down transistor coupled between ground ($V_{SS}$) and said level shifting transistor, wherein said first pull-up transistor and said first pull-down transistor are coupled to opposite ends of the channel of said level shifting transistor, the coupling between said first pull-down transistor and said level shifting transistor forming an output node of said first stage;

said level shifting transistor having its gate coupled to said supply voltage;

a trip point shifting circuit comprising:
  a second pull-up transistor, the channel of said second pull-up transistor coupled between said supply voltage and said output node of said first stage;
  circuit means for coupling said first input to the gate of said second pull-up transistor when said dual mode input buffer is operated at said second voltage level, and for turning off said second pull-up transistor when said dual mode input buffer is operated at said first voltage level; and an output serially coupled to said output node of said first stage, said output capable of providing said first CMOS level outputs and said second CMOS level outputs.

2. The dual mode input buffer of claim 1 wherein said circuit means of said trip point shifting circuit comprises:
  a second input indicating whether said dual mode input buffer is operating at said first or second voltage level;
  an invertor coupled between said second input and the gate of a first PMOS transistor
  said first PMOS transistor having its channel coupled between said first input and a first node;
  a first NMOS transistor having its channel coupled between said first input and said first node, the gate of said first NMOS transistor coupled to said second input;
  a second PMOS transistor, the gate of said second PMOS transistor coupled to said second input and the channel of said second PMOS transistor coupled between said supply voltage and said first node;
  said first node coupled to the gate of said second pull-up transistor.

3. The dual mode input buffer of claim 1 wherein said dual mode input buffer further comprises:
  a first PMOS transistor, the gate of said first PMOS transistor coupled to said first input, the channel of said first PMOS transistor coupled between said output node of said first stage and the channel of a second PMOS transistor,
  said second PMOS transistor having its gate coupled to said output of said dual mode input buffer, the channel of said second PMOS transistor coupled between said supply voltage and the channel of said first PMOS transistor.

4. The dual mode input buffer of claim 1 wherein said dual mode input buffer further comprises a first, second, and third CMOS invertor serially coupled between said output node of said first stage and said output of said dual mode input buffer.

5. The dual mode input buffer of claim 1 wherein said first CMOS level outputs are approximately 5 volts for a logical high signal and approximately $V_{SS}$ for a logical low signal, and wherein said first voltage level is approximately 5 volts.

6. The dual mode input buffer of claim 1 wherein said second CMOS level outputs are approximately 3 volts for a logical high signal and approximately $V_{SS}$ for a logical low signal, and wherein said second voltage level is approximately 3 volts.

7. The dual mode input buffer of claim 1 wherein said first pull-up transistor is a PMOS transistor, wherein said first pull-down transistor is an NMOS transistor, and wherein said level shifting transistor is an NMOS transistor.

8. A power down dual mode input buffer having two modes of operation, a first mode which provides first CMOS level outputs from TTL level inputs while operating at a first voltage level, and a second mode of operation which provides second CMOS level outputs from TTL level inputs while operating at a second voltage level, said dual mode input buffer comprising:
  a first input for providing input data to said input buffer, said first input capable of providing said TTL level inputs;
  a first stage comprising:
    a first pull-up transistor, the gate of said first pull-up transistor coupled to said first input, the channel of said first pull-up transistor coupled between a supply voltage and the channel of a level shifting transistor;
    a first pull-down transistor, the gate of said first pull-down transistor coupled to said first input, the channel of said first pull-down transistor coupled between ground ($V_{SS}$) and said level shifting transistor, wherein said first pull-up transistor and said first pull-down transistor are coupled to opposite ends of the channel of said level shifting transistor, the coupling between said first pull-down transistor and said level shifting transistor forming an output node of said first stage;
  power down circuitry comprising:
    a second input for powering down said input buffer, said second input coupled to the gate of said level shifting transistor, said second input turning on said level shifting transistor when operating said power down dual mode input buffer, said second input turning off said level shifting transistor when powering down said power down dual mode input buffer;
    a MOS transistor, the channel of said MOS transistor coupled between said output node of said first stage and ground $V_{SS}$, the gate of said MOS transistor coupled to said second input such that said second input turns off said MOS transistor when operating said power down dual mode input buffer and turns on said MOS transistor when powering down said power down dual mode input buffer; and
  an output serially coupled to said output node of said first stage, said output capable of providing said first CMOS level outputs and said second CMOS level outputs.

9. The power down dual mode input buffer of claim 8 further comprising a trip point shifting circuit comprising:
  a second pull-up transistor, the channel of said second pull-up transistor coupled between said supply voltage and said output node of said first stage;
  circuit means for coupling said first input to the gate of said second pull-up transistor when said power down dual mode input buffer is operated at said second voltage level, and for turning off said second pull-up transistor when said power down dual mode input buffer is operated at said first voltage level.

10. The power down dual mode input buffer of claim 9 wherein said circuit means of said trip point shifting circuit comprises:
   a third input indicating whether said dual mode input buffer is operating at said first or second voltage level;
   an invertor coupled between said third input and the gate of a first PMOS transistor
   said first PMOS transistor having its channel coupled between said first input and a first node;
   a first NMOS transistor having its channel coupled between said first input and said first node, the gate of said first NMOS transistor coupled to said third input;
   a second PMOS transistor, the gate of said second PMOS transistor coupled to said third input and the channel of said second PMOS transistor coupled between said supply voltage and said first node;
   said first node coupled to the gate of said second pull-up transistor.

11. The power down dual mode input buffer of claim 8 further comprising:
   a third PMOS transistor, the gate of said third PMOS transistor coupled to said first input, the channel of said third PMOS transistor coupled between said output node of said first stage and the channel of a fourth PMOS transistor;
   said fourth PMOS transistor having its gate coupled to said output of said power down dual mode input buffer, the channel of said fourth PMOS transistor coupled between said supply voltage and the channel of said third PMOS transistor.

12. The dual mode input buffer of claim 8 further comprising a first, second, and third CMOS invertor serially coupled between said output node of said first stage and said output node of said power down dual mode input buffer.

13. The power down dual mode input buffer of claim 8 wherein said first CMOS level outputs are approximately 5 volts for a logical high signal and approximately $V_{SS}$ for a logical low signal, and wherein said first voltage level is approximately 5 volts.

14. The power down dual mode input buffer of claim 8 wherein said second CMOS level outputs are approximately 3 volts for a logical high signal and approximately $V_{SS}$ for a logical low signal, and wherein said second voltage level is approximately 3 volts.

15. The power down dual mode input buffer of claim 8 wherein said first pull-up transistor is a PMOS transistor, wherein said first pull-down transistor is an NMOS transistor, and wherein said level shifting transistor is an NMOS transistor.

* * * * *

UNITED STATES PATENT AND TRADEMARK OFFICE
CERTIFICATE OF CORRECTION

PATENT NO. : 5,304,872
DATED : 4/19/94
INVENTOR(S) : Avi Avraham, Dror Avni, Daniel G. Genossar It is certified that error appears in the above-indentified patent and that said Letters Patent is hereby corrected as shown below:

Column 2; Line 48; After "operating" and before "the", delete "conditions"; Insert in place thereof --condition--

Column 2; Line 51; Delete "conditions"; Insert in place thereof --condition--

Column 6; Line 44; Delete "and"

Column 8; Line 15; Delete "design"; Insert in place thereof--designed--

Column 8; Line 24; Delete "Invertor"; Insert in place thereof--Inverter--

Column 9; Line 29; Delete "invertor"; Insert in place thereof--inverter--

Column 9; Line 30; Insert --;-- following "transistor"

Column 11; Line 9; Delete "invertor"; Insert in place thereof--inverter--

Column 11; Line 10; Insert--;-- following "transistor"

Column 12; Line 9; Delete "invertor"; Insert in place thereof--inverter--

Signed and Sealed this

Third Day of October, 1995

Attest:

BRUCE LEHMAN

Attesting Officer    Commissioner of Patents and Trademarks